(12) United States Patent
Kataoka et al.

(10) Patent No.: US 9,425,821 B2
(45) Date of Patent: Aug. 23, 2016

(54) CONVERTING DEVICE AND CONVERTING METHOD

(71) Applicant: FUJITSU LIMITED, Kawasaki-shi, Kanagawa (JP)

(72) Inventors: Masahiro Kataoka, Kamakura (JP); Isao Miyashita, Shizuoka (JP); Hiroyuki Kawamura, Shizuoka (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/995,711

(22) Filed: Jan. 14, 2016

(65) Prior Publication Data

US 2016/0211863 A1 Jul. 21, 2016

(30) Foreign Application Priority Data

Jan. 19, 2015 (JP) .................. 2015-008076

(51) Int. Cl.
*H03M 7/34* (2006.01)
*H03M 7/30* (2006.01)
*G06F 17/22* (2006.01)
*H03M 5/14* (2006.01)
*H03M 7/40* (2006.01)

(52) U.S. Cl.
CPC ........ *H03M 7/3084* (2013.01); *G06F 17/2223* (2013.01); *H03M 5/145* (2013.01); *H03M 7/30* (2013.01); *H03M 7/40* (2013.01)

(58) Field of Classification Search
CPC ......... H03M 7/30; H03M 5/145; H03M 7/40
USPC .............. 341/51, 106, 95, 55, 87, 59, 63, 67
See application file for complete search history.

(56) References Cited

U.S. PATENT DOCUMENTS

| 5,442,350 A | * | 8/1995 | Iyer ................... G06F 17/30595 341/106 |
| 6,047,298 A | | 4/2000 | Morishita |
| 7,013,425 B2 | | 3/2006 | Kataoka |

FOREIGN PATENT DOCUMENTS

| JP | 63-127328 | 5/1988 |
| JP | 9-212395 | 8/1997 |
| JP | 2000-269822 | 9/2000 |
| JP | 2003-30030 | 1/2003 |

* cited by examiner

*Primary Examiner* — Joseph Lauture
(74) *Attorney, Agent, or Firm* — Oblon, McClelland, Maier & Neustadt, L.L.P

(57) ABSTRACT

An information processing apparatus receives a compressed file in which character string data with a first character code is compressed by a unit of character string including a single character or a plurality of characters. The information processing apparatus converts compression information included in the compressed file into converted compression information, the compression information mapping each of compressed character string data in the compressed file to each of corresponding unit of character string with the first character code, thereby the converted compression information mapping each of the compressed character string data in the compressed file to each of the corresponding unit of character string with a second character code. The information processing apparatus generates a converted compression file from the converted compression information and each of the compressed character string data.

9 Claims, 16 Drawing Sheets

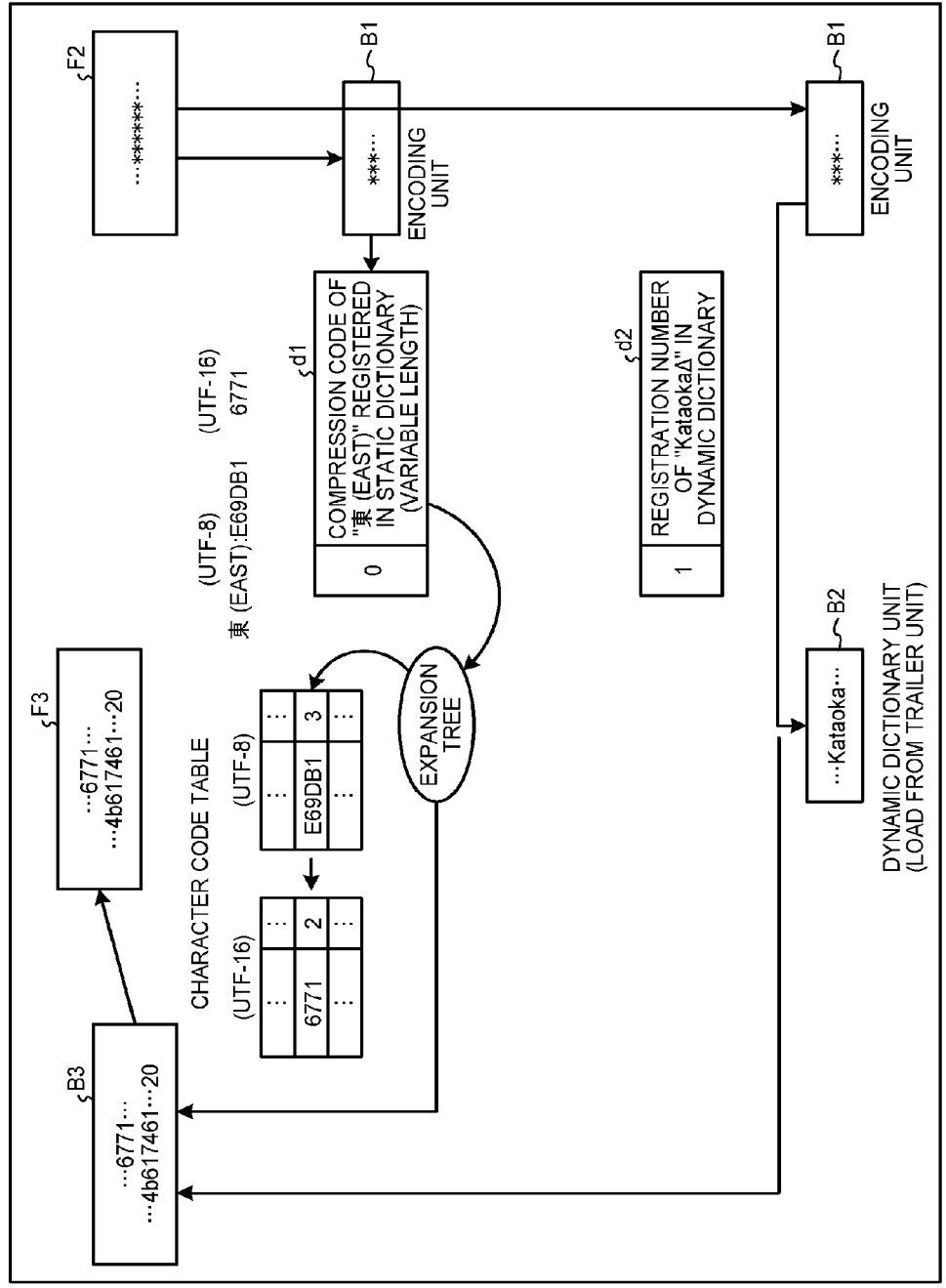

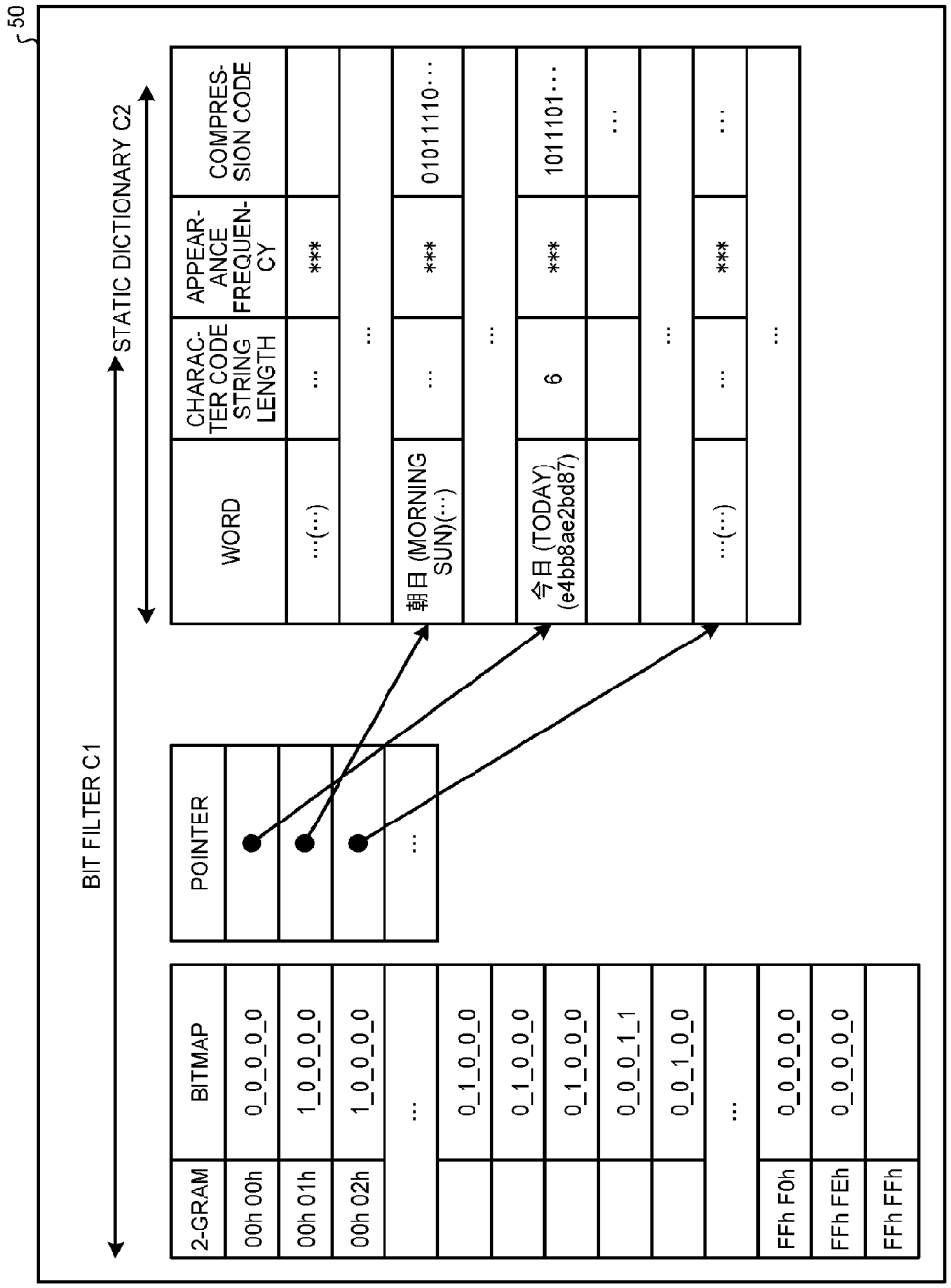

FIG.9
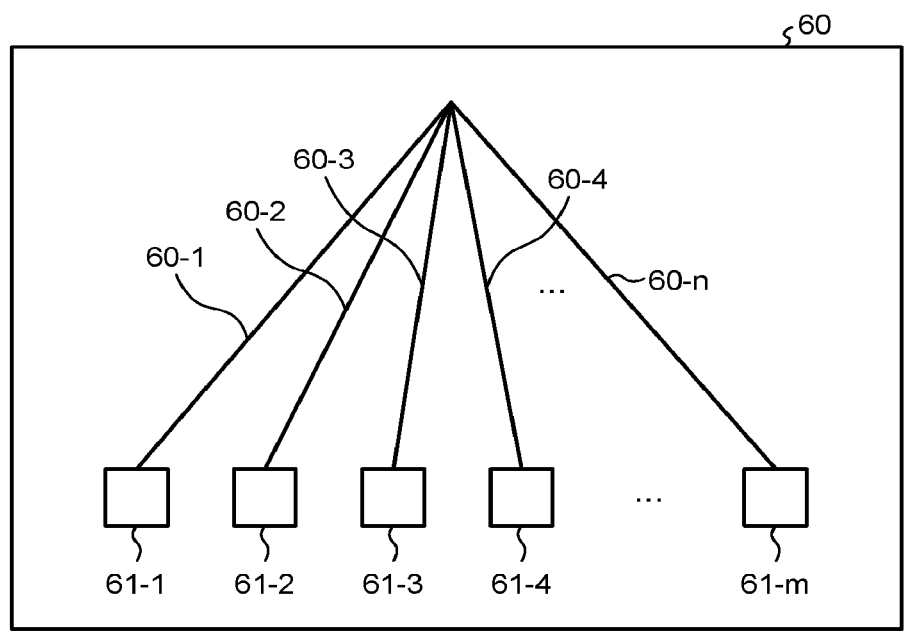
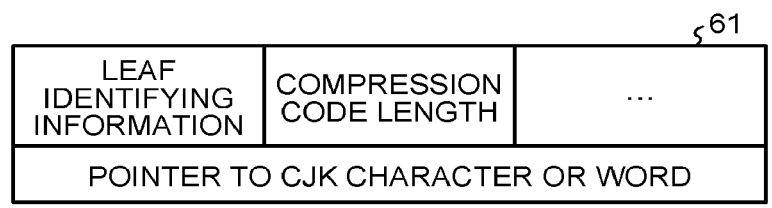

CONVERTING DEVICE AND CONVERTING METHOD

CROSS-REFERENCE TO RELATED APPLICATION

This application is based upon and claims the benefit of priority of the prior Japanese Patent Application No. 2015-008076, filed on Jan. 19, 2015, the entire contents of which are incorporated herein by reference.

FIELD

The embodiment discussed herein is related to a computer-readable recording medium.

BACKGROUND

When character code conversion is performed on compressed data, the conversion is generally performed in two passes. The first pass is expansion processing and the second pass is character code conversion processing (for example, refer to Japanese Laid-open Patent Publication No. 2003-30030). This process requires a storage area that is prepared to store therein the result of the expansion processing.

As compression and expansion algorithms, ZIP that uses LZ77 is widely used. In ZIP, a sliding window is used to determine the longest matching character string of a character string to be compressed, to generate compressed data. The sliding window is also used to determine the longest matching character string of the compressed data to be expanded, to generate expanded data. The longest matching character string is determined by using a sliding window in the unit of byte.

There is a known technology of generating compressed data by converting a character string to be compressed into a compression code assigned to a Japanese word or a Chinese, Japanese, or Korean (CJK) character in a static dictionary, by using the static dictionary.

Patent Document 1: Japanese Laid-open Patent Publication No. 2003-30030

However, when character code conversion is performed on data obtained by expanding compressed data, the unit of data output from the expansion processing of the compressed data differs from the unit of data on which the character code conversion processing is to be performed. To address this, the entire compressed data is developed by expansion processing first, and then character code conversion processing is performed on the developed data, as a separate process. Consequently, as an example, there is a problem in that the storage area is wastefully used. As another example, there is a problem in that the processing takes too much time.

For example, Japanese words or CJK characters, which are characters of Chinese, Korean and Japanese, in a specific character code system, are registered in a static dictionary used in the conventional technology. Japanese words and CJK characters registered in the static dictionary are converted into compression codes assigned thereto, to perform compression processing. In such a case, as illustrated in FIG. 1, in expansion processing, an expansion tree corresponding to the static dictionary is used to expand the entire compressed data, and the expanded data, which is entirely expanded, is stored in the storage area. In the character code conversion processing, the character code of the entire expanded data stored in the storage area is converted, to generate converted data. As a result, in the expansion processing, the expansion result of the entire compressed data is stored in the storage area. Consequently, the storage area is wastefully used. Also, processing time of the expansion processing and the character code conversion processing takes too much time.

SUMMARY

According to an aspect of an embodiment, a non-transitory computer-readable recording medium stores therein a converting program. The converting program causes a computer to perform a process. The process includes inputting a compressed file in which character string data with a first character code is compressed by a unit of character string including a single character or a plurality of characters. The process includes converting compression information included in the compressed file into converted compression information, the compression information mapping each of compressed character string data in the compressed file to each of corresponding unit of character string with the first character code, thereby the converted compression information mapping each of the compressed character string data in the compressed file to each of the corresponding unit of character string with a second character code. The process includes generating a converted compression file from the converted compression information and each of the compressed character string data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A is a diagram (1) illustrating an exemplary flow of expansion processing performed by the information processing apparatus according to the present embodiment;

FIG. 8B is a diagram (2) illustrating another example of a data structure of a compression tree;

FIG. 9 is a diagram illustrating an example of a data structure of an expansion tree;

DESCRIPTION OF EMBODIMENT

Preferred embodiments of a computer program disclosed in the present invention will be explained in detail with reference to accompanying drawings. The computer program, for example, includes a compression program and an expansion program. However, it is to be understood that the present invention is not limited to the disclosed embodiment.

Figure 1:
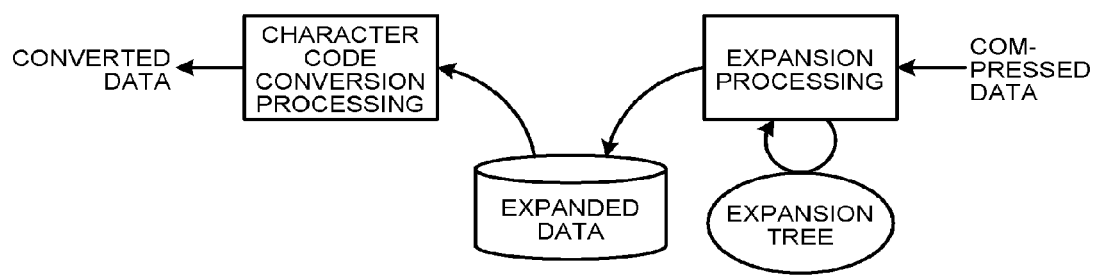
FIG. 1 is a an example of expansion processing.
Figure 2:
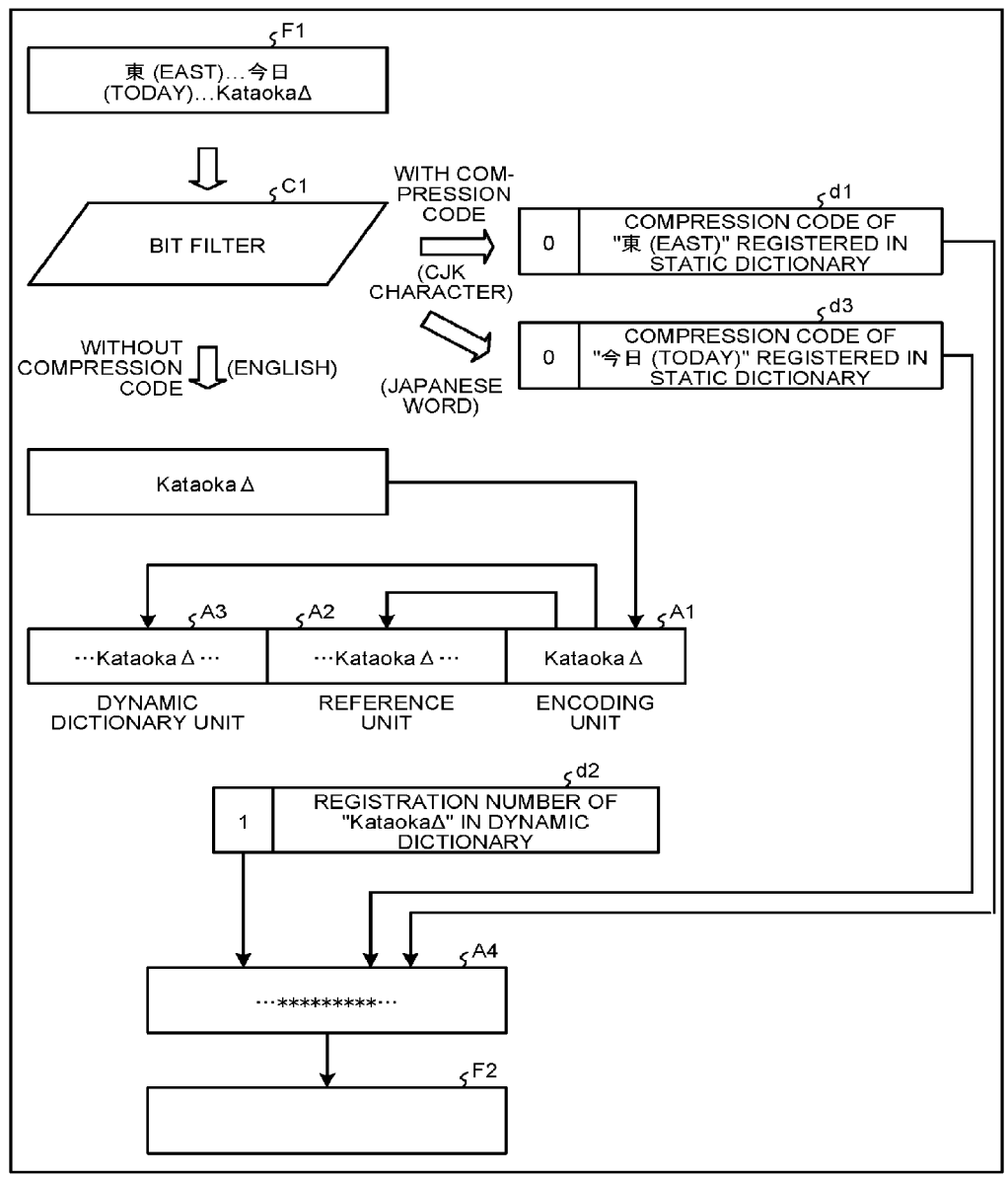
FIG. 2 is a diagram illustrating an exemplary flow of compression processing performed by an information processing apparatus according to the present embodiment.

FIG. 2 is a diagram illustrating an exemplary flow of compression processing performed by an information processing apparatus according to the present embodiment. The information processing apparatus provides a storage area A1, a storage area A2, a storage area A3, and a storage area A4 in the memory, as a work area for compression processing. In the following examples, the storage area A1, the storage area A2, and the storage area A3 are referred to as an encoding unit, a reference unit, and a dynamic dictionary unit, respectively.

The information processing apparatus reads out a file F1 to be compressed, and if the text in the file F1 to be compressed is in English, extracts a character string, which is a section from the first character to the terminal symbol, as an English word, from the text in the file F1. The information processing apparatus, if the text in the file F1 to be compressed is in CJK characters or in Japanese words, extracts in the unit of character from the first character, as a CJK character or a Japanese word, from the text in the file F1 to be compressed. For example, the file F1 includes data of ". . . 東 (East) . . . 今日 (Today) . . . KataokaΔ", which is a specific character code system. There are words such as "東 (East)", "今日 (Today)", and "KataokaΔ". "東 (East)" is an example of a CJK character, and "今日 (Today)" is an example of a Japanese word, and each of them is indicated in a character code string that differs depending on the character code system. "Kataoka" is an example of a person's name in English, and is indicated in a character code string that does not differ depending on the character code system. The terminal symbol is a symbol such as space ( ) comma (,), and period (.). In the present embodiment, as an example, the terminal symbol is indicated in "Δ (triangle)". In the present embodiment, as an example, it is assumed that the character code system of the text in the file F1 is 8-bit Unicode Transformation Format (UTF-8).

The information processing apparatus compares a character code string with a bit filter C1, and determines whether the character code string hits the bit filter C1. The bit filter is a filter for specifying the character code string of a word, which is to be compressed by using the static dictionary. The information processing apparatus, if the character code string hits the bit filter C1, converts the character code string to a compression code corresponding to the character code string of the word based on a static dictionary, and outputs compressed data. On the other hand, the information processing apparatus, if the character code string does not hit the static dictionary of the bit filter C1, converts the character code string to a compression code corresponding to the character code string of the word registered in a dynamic dictionary, and outputs compressed data.

The static dictionary is a dictionary that specifies the appearance frequency of a word or a character that appears in a document, based on a general English dictionary, a Japanese dictionary, a textbook, and the like, and assigns a shorter compression code to a word or a character that appears more frequently. In the static dictionary, a compression code is assigned to the unit of Japanese word or to the unit of CJK character.

In the dynamic dictionary, the character code string that does not hit the bit filter C1 is stored in a sliding window encoding unit, and is checked with character code strings accumulated in the reference unit. The matched character code string is registered in the dynamic dictionary, and the registration number is assigned to the compression code. The dynamic dictionary will be described in detail below.

The generation processing of compressed data of the CJK character "東 (East)" in the file F1 to be compressed performed by the information processing apparatus will now be described. It is assumed that the character code string of the CJK character hits the bit filter C1.

The information processing apparatus compares the CJK character "東 (East)" with the bit filter C1, and determines whether the CJK character "東 (East)" hits the bit filter C1. Because the CJK character "東 (East)" hits the bit filter C1, the information processing apparatus encodes the CJK character "東 (East)" to a compression code registered in the static dictionary. The information processing apparatus then generates compressed data d1 including an identifier "0" and the compression code of the CJK character "東 (East)". The identifier "0" is information indicating that the character code string is encoded based on the static dictionary. The information processing apparatus then writes the compressed data d1 in the storage area A4.

Next, the generation processing of compressed data of the Japanese word "今日 (Today)" in the file F1 to be compressed performed by the information processing apparatus will now be described. It is assumed that the character code string of the Japanese word hits the bit filter C1.

The information processing apparatus compares the Japanese word "今日 (Today)" with the bit filter C1, and determines whether the Japanese word "今日 (Today)" hits the bit filter C1. Because the Japanese word "今日 (Today)" hits the bit filter C1, the information processing apparatus encodes the Japanese word "今日 (Today)" to a compression code registered in the static dictionary. The information processing apparatus then generates compressed data d3 including the identifier "0" and the compression code of the Japanese word "今日 (Today)". The identifier "0" is information indicating that the character code string is encoded based on the static dictionary. The information processing apparatus then writes the compressed data d3 in the storage area A4.

Next, the generation processing of compressed data of the English character string "KataokaΔ" in the file F1 to be compressed performed by the information processing apparatus will now be described. It is assumed that the character string "KataokaΔ" does not hit the bit filter C1.

The information processing apparatus compares the character string "KataokaΔ" with the bit filter C1, and determines whether the character string "KataokaΔ" hits the bit filter C1. Because the character string "KataokaΔ" does not hit the bit filter C1, the information processing apparatus executes the following processing.

The information processing apparatus stores the character string "KataokaΔ" in the storage area A1, and by comparing the character strings stored in the storage area A2 with the character strings in the storage area A1, searches for the longest matching character string. The longest matching character string is a character string that matches the longest, among the character strings stored in the storage area A1 and the character strings stored in the storage area A2. For example, if the character string " . . . KataokaΔ . . . " is already stored in the storage area A2, the longest matching character string will be "KataokaΔ". The information processing apparatus searches for "K" in the storage area A2, and then sequentially checks whether "a", "t", "a", "o", "k", "a," and "Δ" are continued from the position of "K" in the storage area A2 obtained by the search.

The information processing apparatus, if the longest matching character string is equal to or more than a predetermined length Lmin, registers the longest matching character string "KataokaΔ" in the storage area A3 of the dynamic dictionary unit. The information processing apparatus then generates a compression code based on the registered contents of the dynamic dictionary unit. In other words, the information processing apparatus specifies the registration number of the longest matching character string registered in the dynamic dictionary unit as the compression code of the character string "KataokaΔ". The information processing apparatus then generates compressed data d2 including an identifier "1" and the compression code of the character string "KataokaΔ". The identifier "1" is information indicating that the character string is encoded based on the dynamic dictionary. The information processing apparatus then writes the compressed data d2 in the storage area A4. The information processing apparatus also updates the storage area A2, by adding the character string stored in the storage area A1, in the storage area A2.

The storage area A2 is a data area whose size is defined. For example, the storage area A2 is a storage area with a fixed length of 64 kilobytes. The information processing apparatus, to store data equal to or more than the data size defined for the storage area A2, stores new data on top of old data stored at the top of the storage area A2. The top position of the data stored in the storage area A2 is indicated by a relative address from the writing position, which is updated according to the storage of data.

The storage area A3 is a storage area whose data size is defined according to the size of the input file. For example, the storage area A3 is a storage area with a fixed length of 64 kilobytes. For example, the information processing apparatus, to store data equal to or more than the data size defined for the storage area A3, prevents to store new data.

Figure 3:
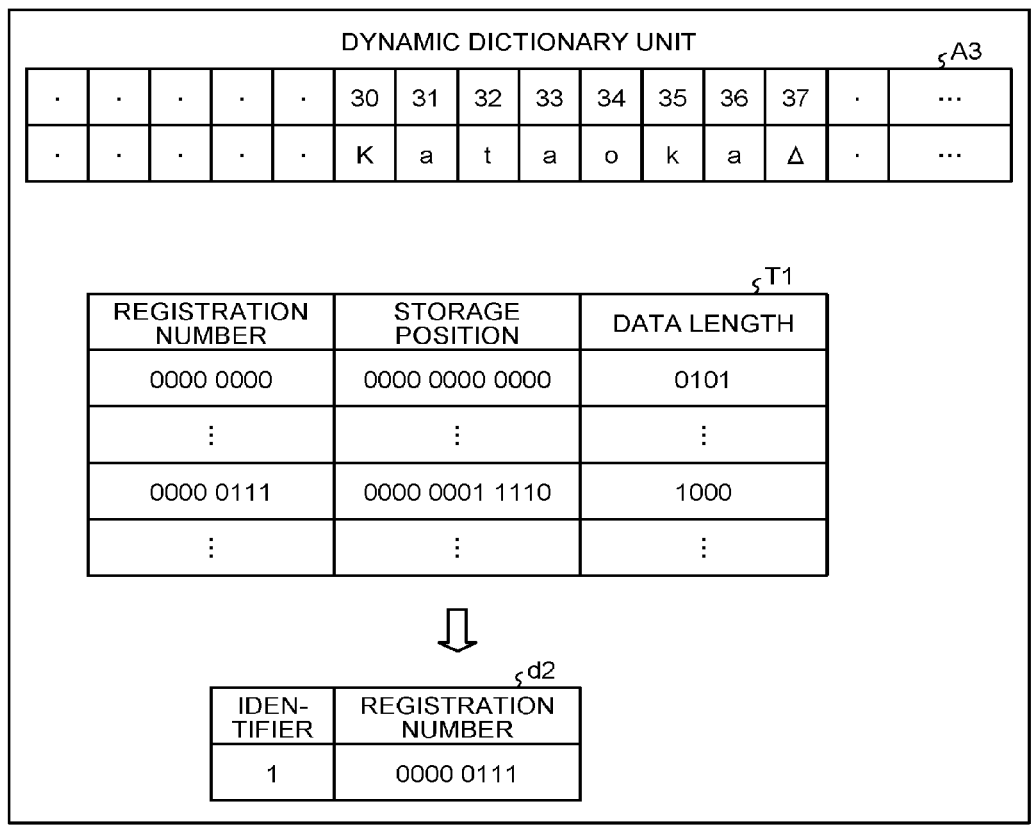
FIG. 3 is an example of a dynamic dictionary unit.

FIG. 3 is an example of a dynamic dictionary unit. The dynamic dictionary unit illustrated in FIG. 3 includes the storage area A3 and a reference table T1. The reference table T1 holds therein a registration number, a storage position, and a data length in an associated manner. In the example illustrated in FIG. 3, the registration number, the storage position, and the data length are represented in binary. The registration number is information that indicates the registration order of the longest matching character code string registered in the storage area A3. In the present embodiment, the registration number of the first registered data is "00000000". The storage position is information that indicates the position (byte) of the first character of the longest matching character string stored in the storage area A3. The data length is information that indicates the length of the longest matching character string.

For example, if the longest matching character string "KataokaΔ" is the longest matching character string that is registered seventh in the storage area A3, the information processing apparatus registers "00000111" under the registration number of the reference table T1, as the registration number corresponding to the longest matching character string "KataokaΔ". Because the first character "K" of the longest matching character string "KataokaΔ" is stored under "30" in the storage area A3, the information processing apparatus registers "000000001110" under the storage position. Because the data length of the longest matching character string "KataokaΔ" is "8", the information processing apparatus registers "1000" under the data length.

As illustrated in FIG. 3, if the longest matching character string "KataokaΔ" is registered in the dynamic dictionary unit, the registration number of the longest matching character string "KataokaΔ" is "00000111". In this case, the information processing apparatus assigns "00000111" as the compression code of the character string "KataokaΔ", and the information processing apparatus generates compressed data d2 including the identifier "1" and the registration number "00000111", as the compressed data d2 of the character string "KataokaΔ".

Figure 4:
FIG. 4 is an example of a block diagram of a compression file F2.

FIG. 4 is an example of a block diagram of a compression file F2. As illustrated in FIG. 4, the compression file F2 includes a header unit, compressed data, and a trailer unit. The header unit, for example, includes information to identify the compression algorithm used for generating the compression file F2, and information such as parameters used for compression. The compressed data corresponds to each compressed data generated by the information processing apparatus. The trailer unit includes information in the dynamic dictionary unit after compression processing is completed. The information in the dynamic dictionary unit corresponds to the information in the dynamic dictionary unit illustrated in FIG. 3.

Figure 5B:
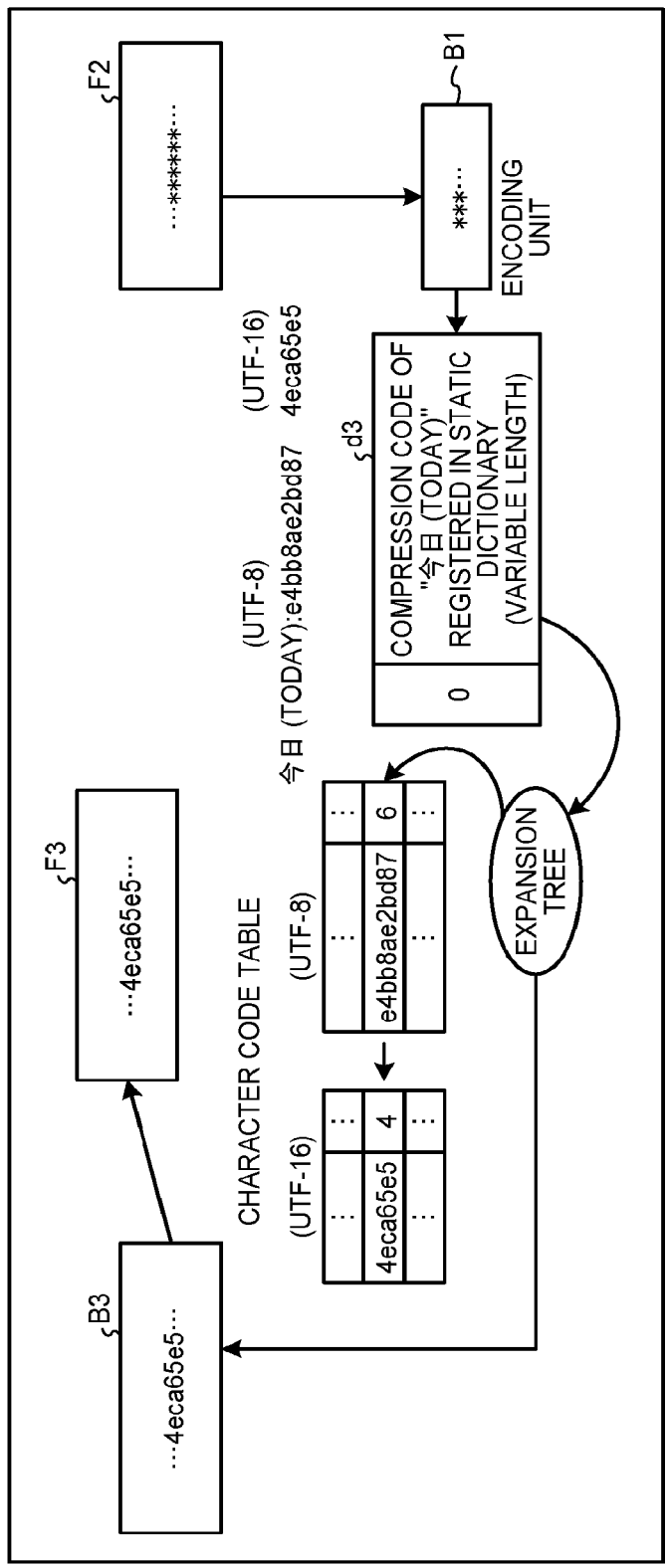
FIG. 5B is a diagram (2) illustrating another exemplary flow of expansion processing performed by the information processing apparatus according to the present embodiment.

FIG. 5A and FIG. 5B are diagrams illustrating exemplary flows of expansion processing performed by the information processing apparatus according to the present embodiment. FIG. 5A illustrates a flow of expansion processing of compressed data obtained by compressing a CJK character, and a flow of expansion processing of compressed data obtained by compressing an English character string. FIG. 5B illustrates a flow of expansion processing of compressed data obtained by compressing a Japanese word. The information processing apparatus provides a storage area B1, a storage area B2, and a storage area B3 in the memory, as a work area for expansion processing. The information processing apparatus loads the compression file F2 in the storage area B1, and sequentially reads out compressed data. The information processing apparatus, based on the compressed data being read out, generates expanded data. In the expansion processing according to the present embodiment, the expansion result of the compressed data is the expansion result at the state when the character code is converted. In FIG. 5A and FIG. 5B, the expanded data is at the state when the character code is converted from UTF-8 to UTF-16.

The information processing apparatus performs expansion processing according to the identifier included in the compressed data. The information processing apparatus stores the generated expanded data in the storage area B3, and an expansion file F3 is generated based on the expanded data stored in the storage area B3. The information processing apparatus also loads the information in the dynamic dictionary unit stored in the trailer unit illustrated in FIG. 4, in the storage area B2. In the following explanation, the storage area B1 is appropriately referred to as the encoding unit, and the storage area B2 is referred to as the dynamic dictionary unit. The expansion file F3 is an example of a converted compression file.

In FIG. 5A, expansion processing is performed on the compressed data d1 and d2 illustrated in FIG. 2.

The information processing apparatus reads out the compressed data d1 and determines the identifier of the compressed data d1. The information processing apparatus, if the identifier of the compressed data d1 is "0", determines that the static dictionary encoded the compressed data d1. The information processing apparatus compares the compressed data d1 with the expansion tree, and specifies the pointer to the expanded data indicated by the expansion tree. The information processing apparatus then specifies the expanded data whose character code is converted, based on the pointer to the specified expanded data. In other words, the information processing apparatus specifies the expanded data whose character code is converted from UTF-8 to UTF-16.

For example, the information processing apparatus replaces the UTF-8 character code table corresponding to the pointer to the expanded data, with the UTF-16 character code table. Here, the character code table is a table that indicates the character code strings relative to the CJK characters, and there is one for each character code system. In the character code table for each character code system, character code strings are set in the sequence of the CJK characters determined in advance. The information processing apparatus specifies the expanded data in UTF-16, based on the replacing UTF-16 character code table and the pointer to the expanded data. As an example, it is assumed that the pointer to the expanded data from the expansion tree is pointing at "E69DB1" in the UTF-8 character code table. This "E69DB1" is a UTF-8 character code string for the CJK character "東 (East)". Because the pointer to the expanded data from the expansion tree is pointing at "6771" in the UTF-16 character code table, after the character code table is replaced, the expanded data in UTF-16 relative to the pointer to the expanded data is specified. In other words, the character code string "6771", which is converted from UTF-8 to UTF-16, is specified.

The information processing apparatus then writes the expanded data, whose character code is converted, in the storage area B3.

The information processing apparatus reads out the compressed data d2 and determines the identifier of the compressed data d2. The information processing apparatus, if the identifier of the compressed data d2 is "1", determines that the dynamic dictionary encoded the compressed data d2. The information processing apparatus then generates expanded data by referring to the dynamic dictionary, based on the compression code in the compressed data d2. The information processing apparatus then specifies the expanded data whose character code is converted. English characters have the same character code strings in any character code system including American Standard Code for Information Interchange (ASCII). Consequently, even if the character code of the generated expanded data is converted from UTF-8 to UTF-16, the character code string remains the same.

For example, the information processing apparatus compares the registration number included in the compressed data d2 with the reference table T1 in the dynamic dictionary unit, and specifies the storage position and the data length in the storage area B2. The information processing apparatus reads out the data corresponding to the storage position and the data length from the storage area B2, and assigns the data being read out as the expanded data. For example, because the registration number in the compressed data d2 indicates "KataokaΔ" in the dynamic dictionary unit, "KataokaΔ" is generated as the expanded data.

The information processing apparatus then writes the expanded data whose character code is converted, in the storage area B3.

In FIG. 5B, expansion processing is performed on the compressed data d3 illustrated in FIG. 2.

The information processing apparatus reads out the compressed data d3 and determines the identifier of the compressed data d3. The information processing apparatus, if the identifier of the compressed data d3 is "0", determines that the static dictionary encoded the compressed data d3. The information processing apparatus then compares the compressed data d3 with the expansion tree, and specifies the pointer to the expanded data indicated by the expansion tree. The information processing apparatus then specifies the expanded data whose character code is converted, based on the specified pointer to the expanded data. In other words, the information processing apparatus specifies the expanded data whose character code is converted from UTF-8 to UTF-16.

For example, the information processing apparatus replaces the UTF-8 character code table corresponding to the pointer to the expanded data, with the UTF-16 character code table. Here, the character code table is a table that indicates the character code strings corresponding to Japanese words, and there is one for each character code system. In the character code table for each character code system, character code strings are set in sequence of the Japanese words determined in advance. The information processing apparatus specifies the expanded data in UTF-16, based on the replacing UTF-16 character code table and the pointer to the expanded data. As an example, it is assumed that the pointer to the expanded data from the expansion tree is pointing at "e4bb8ae2bd87" in the UTF-8 character code table. This "e4bb8ae2bd87" is a UTF-8 character code string for a Japanese word "今日 (Today)". Because the pointer to the expanded data from the expansion tree is pointing at "4eca65e5" in the UTF-16 character code table, after the character code table is replaced, the expanded data in UTF-16 relative to the pointer to the expanded data is specified. In other words, the character code string "4eca65e5", which is converted from UTF-8 to UTF-16, is specified.

The information processing apparatus, then writes the expanded data, whose character code is converted, in the storage area B3. The details of the character code table will be described below.

Figure 6:
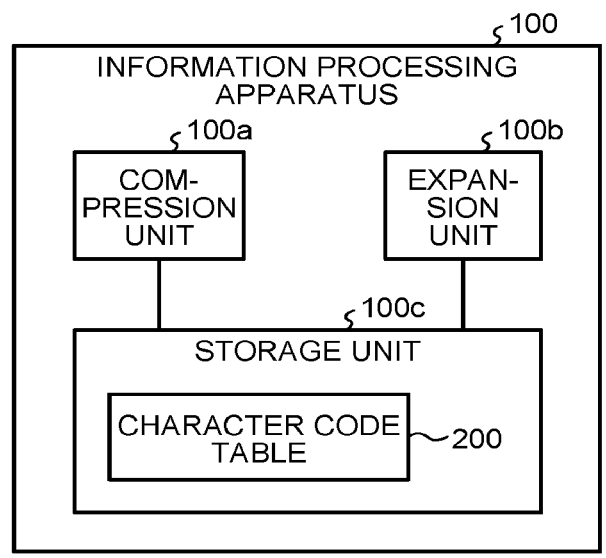
FIG. 6 is a functional block diagram illustrating a configuration of the information processing apparatus according to the present embodiment.

FIG. 6 is a functional block diagram illustrating a configuration of the information processing apparatus according to the present embodiment. As illustrated in FIG. 6, an information processing apparatus 100 includes a compression unit 100*a*, an expansion unit 100*b*, and a storage unit 100*c*.

The compression unit 100*a* is a processing unit that executes the compression processing illustrated in FIG. 2. The expansion unit 100*b* is a processing unit that executes the expansion processing illustrated in FIG. 5A and FIG. 5B. The storage unit 100*c* stores therein a character code table 200. The character code table 200 is a table used to expand compressed data when the identifier of the compressed data is "0", and is included in each character code system. The character code table 200 includes expansion character code strings of CJK characters and expansion character code strings of Japanese words.

Figure 7:
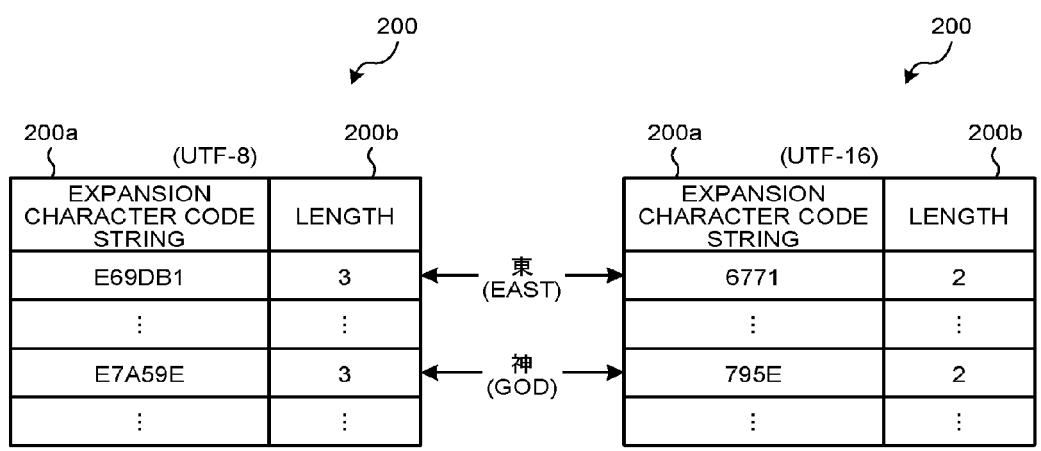
FIG. 7 is an example of a data structure of a character code table according to the present embodiment.

A data structure of the character code table 200 will now be described with reference to FIG. 7. FIG. 7 is an example of a data structure of a character code table according to the present embodiment. FIG. 7 illustrates the character code table 200 when the character code system is UTF-8 and UTF-16. As illustrated in FIG. 7, the character code table 200 stores therein expansion character code strings 200a as well as the lengths 200b. The expansion character code string 200a is a character code string after being expanded, and corresponds to a character code string of a CJK character or a Japanese word indicated in the character code system. The length 200b indicates the length of the expansion character code string 200a. The expansion character code strings 200a of different character code systems are stored at the same position, if the CJK characters or the Japanese words are the same. In other words, if the identifier of the compressed data is "0", the information processing apparatus compares the compressed data d1 with the expansion tree, and specifies the pointer to the expanded data indicated by the expansion tree. This pointer to the expanded data points at the same position in each character code system.

As an example, the left diagram in FIG. 7 illustrates the character code table 200 when the character code system is UTF-8. The right diagram in FIG. 7 illustrates the character code table 200 when the character code system is UTF-16. If the character code system is UTF-8, "E69DB1" is stored as the expansion character code string 200a, and "3" is stored as the length 200b. This "E69DB1" is the character code string of the CJK character "東 (East)" in UTF-8. If the character code system is UTF-16, "6771" is stored as the expansion character code string 200a, and "2" is stored as the length 200b. This "6771" is the character code string of the CJK character "東 (East)" in UTF-16. The expansion character code string 200a of the CJK character "東 (East)" is stored at the same position in both UTF-8 and UTF-16. Similarly, the expansion character code string 200a of a CJK character "神 God)" is also stored at the same position in both UTF-8 and UTF-16.

Returning to FIG. 6, the information processing apparatus 100 sets the storage areas A1, A2, A3, A4, B1, B2, and B3 illustrated in FIG. 2, FIG. 5A, and FIG. 5B, in the storage unit 100c. The storage unit 100c also stores therein the compression tree and the expansion tree.

Figure 8A:
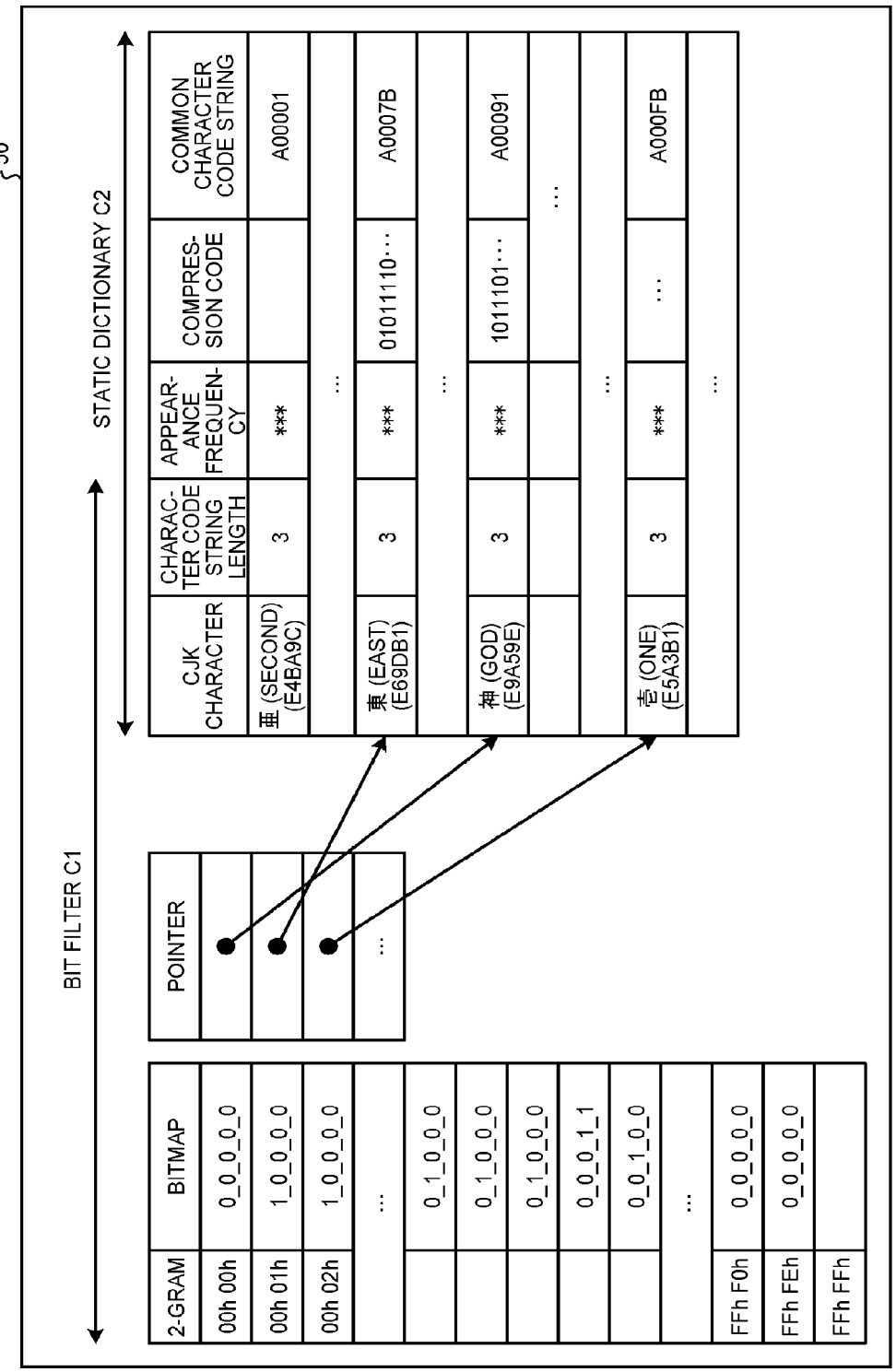
FIG. 8A is a diagram (1) illustrating an example of a data structure of a compression tree.

FIG. 8A and FIG. 8B are diagrams illustrating examples of a data structure of a compression tree. FIG. 8A illustrates a data structure of a compression tree corresponding to CJK characters. FIG. 8B illustrates a data structure of a compression tree corresponding to Japanese words. There is one compression tree for each character code system.

As an example, FIG. 8A illustrates a compression tree when the character code system is UTF-8. As illustrated in FIG. 8A, a compression tree 50 includes a 2-gram, a bitmap, a pointer, a CJK character, a character code string length, an appearance frequency, a compression code, and a common character code string. Among these, the 2-gram, the bitmap, the pointer, the CJK character, and the character code string length correspond to the bit filter C1. The CJK character, the character code string length, the appearance frequency, the compression code, and the common character code string correspond to a static dictionary C2.

The 2-gram is information that indicates a character code string of two characters. The bitmap indicates a bitmap corresponding to the 2-gram character code string. For example, the bitmap corresponding to "00h00h" is "0_0_0_0_0". The pointer is a pointer that indicates the position of the CJK character corresponding to the bitmap.

The CJK character is a CJK character registered in the static dictionary C2, and is indicated in a character code string. Here, the character code string is indicated in the parentheses. The character code string length is the length of the character code string corresponding to the CJK character. The appearance frequency is the frequency of the appearance of the CJK character. The compression code is a compression code assigned to the CJK character. The common character code string is an internal character code string assigned to the CJK character and is the character code string commonly used even if the character code system differs.

FIG. 8B illustrates a compression tree when the character code system is UTF-8. As illustrated in FIG. 8B, the compression tree 50 includes a 2-gram, a bitmap, a pointer, a word, a character code string length, an appearance frequency, and a compression code. Among these, the 2-gram, the bitmap, the pointer, the word, and the character code string length correspond to the bit filter C1. The word, the character code string length, the appearance frequency, and the compression code correspond to the static dictionary C2.

The 2-gram is information that indicates the character code string of two characters. The bitmap indicates a bitmap corresponding to the 2-gram character code string. For example, the bitmap corresponding to "00h00h" is "0_0_0_0_0". The pointer is a pointer that indicates the position of a word corresponding to the bitmap.

The word is a Japanese word registered in the static dictionary C2, and is indicated in a character code string. Here, the character code string is indicated in the parentheses. The character code string length is the length of the character code string corresponding to the word. The appearance frequency is the frequency of the appearance of the word. The compression code is a compression code assigned to the word.

FIG. 9 is a diagram illustrating an example of a data structure of an expansion tree. As illustrated in FIG. 9, an expansion tree 60 includes a plurality of branches 60-1 to 60-n and leaves 61-1 to 61-m. A predetermined bit string is assigned to each of the branches 60-1 to 60-n. The information processing apparatus 100 compares the bit string of the compressed data with the bit strings assigned to the branches 60-1 to 60-n, and specifies a leaf connected to the branch that hits the bit string of the compressed data. Information such as a character corresponding to the compressed data is stored in the leaf.

For example, a data structure of a leaf is as illustrated in 61. For example, a leaf stores therein leaf identifying information, a compression code length, and a pointer to a CJK character or a word. The leaf identifying information is information used to uniquely identify a leaf. The compression code length is information that indicates the valid length among the bit strings of the compressed data compared with each of the branches 60-1 to 60-n. The pointer to a CJK character or a word is information that uniquely indicates the expanded data, when the compression code is expanded. The pointer corresponds to the pointer to the expanded data.

For example, it is assumed that a bit string "010111110111101" is assigned to the branch 60-4, the compression code length of the leaf 61-4 connected to the branch 60-4 is "11", and the CJK character indicated by the pointer to a CJK character or a word is "東 (East)". In this case, the bit string of "01011111011", which is from the top to the eleventh bit of the bit string, is a compression code corresponding to the CJK character "東 (East)".

Figure 10:
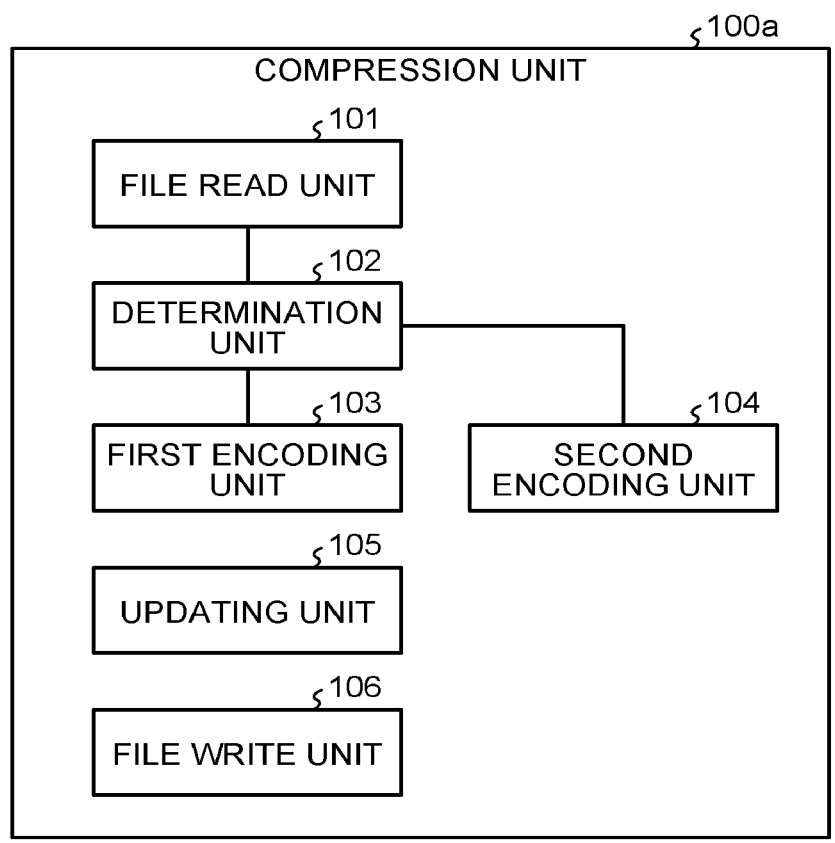
FIG. 10 is a functional block diagram illustrating an example of a configuration of a compression unit according to the present embodiment.

FIG. 10 is a functional block diagram illustrating an example of a configuration of a compression unit according to the present embodiment. As illustrated in FIG. 10, the compression unit 100a includes a file read unit 101, a determination unit 102, a first encoding unit 103, a second encoding unit 104, an updating unit 105, and a file write unit 106.

The file read unit 101 is a processing unit that reads out data of the content portion in the file F1. The file read unit 101 extracts the character code strings included in the data being read out from the top, and sequentially outputs the extracted character code strings to the determination unit 102. For example, the file read unit 101, if the file F1 is in English, extracts a character code string, which is a section from the first character to the terminal symbol, as an English word. The file read unit 101, if the file F1 is in CJK characters or Japanese words, extracts a character code string in the unit of character from the first character, as a CJK character or a Japanese word.

The determination unit 102 is a processing unit that compares the character code string with the bit filter C1, and determines whether the character code string hits the bit filter C1. The determination unit 102, if the character code string hits the bit filter C1, outputs the character code string to the first encoding unit 103. This is when the character code string is a CJK character or a Japanese word. The determination unit 102, if the character code string does not hit the bit filter C1, outputs the character code string to the second encoding unit 104. This is when the character code string is an English word.

The processing performed by the determination unit 102 when the character code string to be determined is a character code string of a CJK character will now be described with reference to FIG. 8A. It is assumed that the character code string to be determined is the character code string "E69DB1" of the CJK character "東 (East)". The determination unit 102 compares the character code string to be determined with the 2-gram of the bit filter C1 by 2-gram at a time from the top, and specifies the bitmap. For example, if the character code string is "E69DB1", the determination unit 102 combines the bitmaps that correspond to "E69D" and "9DB1". The determination unit 102, as an example, combines the bitmaps by setting "1" to the digit that corresponds to the combined bitmap, and setting "0" to the others, in each digit in the bitmap.

For example, it is assumed that the bitmap of "E69D" is "1_0_0_0_0", and the bitmap of "9DB1" is "0_1_1_0_0". In this case, a bitmap obtained by combining the two bitmaps is "1_1_1_0_0".

The determination unit 102 compares the combined bitmap with the pointer of the bit filter C1, and specifies the CJK character at the position pointed by the pointer corresponding to the bitmap. The determination unit 102 then searches for the CJK character corresponding to the character code string to be determined, sequentially from the specified CJK character. Here, it is assumed that the static dictionary includes units of Japanese words or units of CJK characters. Because there is a CJK character corresponding to the character code string to be determined, the determination unit 102 determines that the character code string to be determined hits the bit filter C1. The processing performed by the determination unit 102 when the character code string to be determined is a character code string of a Japanese word, is similar to the processing performed by the determination unit 102 when the character code string to be determined is a character code string of a CJK character, and the description thereof will be omitted.

The first encoding unit 103 is a processing unit that encodes the character code string obtained from the determination unit 102 based on the static dictionary C2. The first encoding unit 103 refers to the static dictionary C2, specifies the CJK character or the Japanese word corresponding to the character code string from the static dictionary C2, and specifies the compression code corresponding to the CJK character or the Japanese word that has been specified. The first encoding unit 103 then generates compressed data including the identifier "0" and the compression code of the CJK character or the Japanese word registered in the static dictionary C2. The first encoding unit 103 then outputs the compressed data to the file write unit 106.

The second encoding unit 104 is a processing unit that encodes the character code string obtained from the determination unit 102 based on the dynamic dictionary. The second encoding unit 104 stores the character code string in the storage area A1, which is the encoding unit. The second encoding unit 104 compares the storage area A1 with the data stored in the storage area A2, which is the reference unit, and searches for the longest matching character string.

The second encoding unit 104, if the longest matching character string is equal to or more than the predetermined length Lmin, registers the longest matching character string in the storage area A3 in the dynamic dictionary unit. The second encoding unit 104 generates a compression code based on the registered contents of the dynamic dictionary unit. In other words, the second encoding unit 104 specifies the registration number of the longest matching character string registered in the dynamic dictionary unit as the compression code of the character string. The second encoding unit 104 generates compressed data including the identifier "1" and the registration number in the dynamic dictionary, and outputs the compressed data to the file write unit 106.

For example, the second encoding unit 104, if the character string "KataokaΔ" is the longest matching character string registered second in the storage area A3, registers "00000111" under the registration number of the reference table T1, as the registration number corresponding to the longest matching character string "KataokaΔ". The second encoding unit 104, because the first character "K" of the longest matching character string "KataokaΔ" is stored under "30" in the storage area A3, registers "000000011110" under the storage position. The second encoding unit 104, because the data length of the longest matching character string "KataokaΔ" is "8", registers "10000" under the data length.

As illustrated in FIG. 3, if the longest matching character string "KataokaΔ" is registered in the dynamic dictionary unit, the second encoding unit 104 sets the registration number of the longest matching character string "KataokaΔ" as "00000111". In this case, the second encoding unit 104 sets the compression code of the character string "KataokaΔ" as "00000111". Consequently, the second encoding unit 104 generates compressed data including the identifier "1" and the registration number "00000111" as the compressed data of the character string "KataokaΔ". The second encoding unit 104 then outputs the compressed data to the file write unit 106.

If the character string the same as the character string to be encoded is already registered in the storage area A3, the second encoding unit 104 specifies the registration number of the character string that is already registered, as the compression code of the character string. For example, the second encoding unit 104 compares the character string to be encoded with each character string in the storage area A3, and if the character string the same as the character string to be encoded is not registered in the storage area A3, searches for the longest matching character string described above.

The updating unit 105 is a processing unit that updates the storage area A2, by storing the character string stored in the storage area A1, in the storage area A2, after second encoding unit 104 completes the search for the longest matching character string is completed. The updating unit 105 updates the storage area A2 every time the second encoding unit 104 completes the search for the longest matching character string.

The file write unit 106 is a processing unit that obtains the compressed data from the first encoding unit 103 and the second encoding unit 104, and writes the obtained compressed data in the storage area A4.

Figure 11:
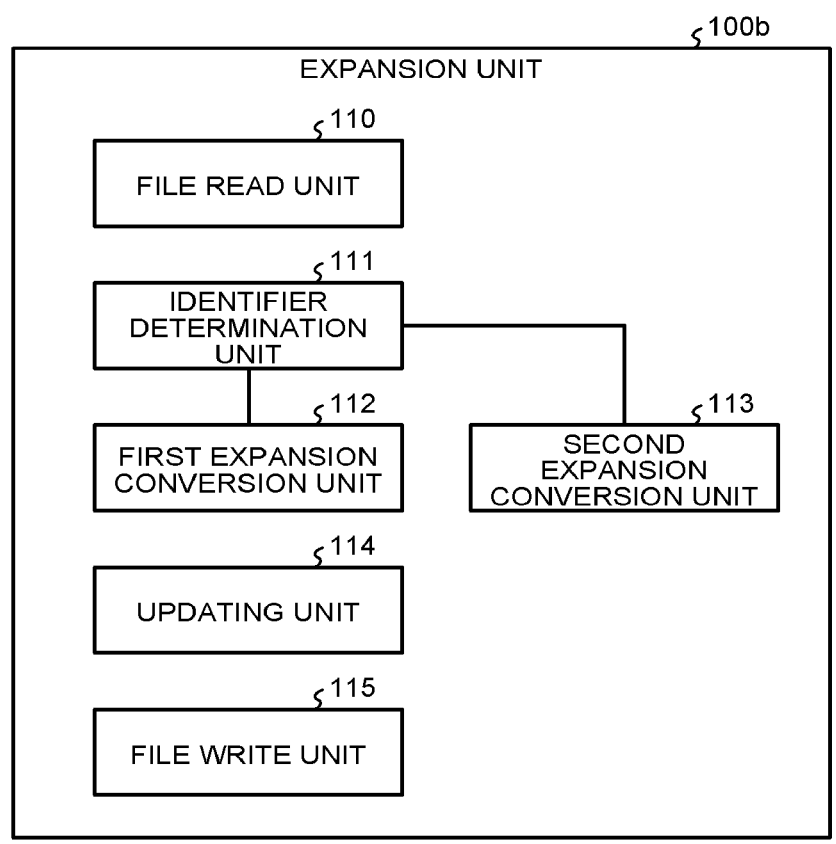
FIG. 11 is a functional block diagram illustrating an example of a configuration of an expansion unit according to the present embodiment.

FIG. 11 is a functional block diagram illustrating an example of a configuration of an expansion unit according to the present embodiment. As illustrated in FIG. 11, the expansion unit 100b includes a file read unit 110, an identifier determination unit 111, a first expansion conversion unit 112, a second expansion conversion unit 113, an updating unit 114, and a file write unit 115.

The file read unit 110 is a processing unit that reads out the compressed data in the compression file F2 to the storage area B1. The file read unit 110, if the processing on the compressed data stored in the storage area B1 is finished, reads out new compressed data from the compression file F2, and updates the compressed data stored in the storage area B1.

The file read unit 110 then reads out the information in the dynamic dictionary unit stored in the trailer unit of the compression file F2, and stores it in the storage area B2.

The identifier determination unit 111 is a processing unit that reads out the identifier of the compressed data stored in the storage area B1, and determines whether the identifier is "0" or "1". The identifier corresponds to the first bit of the compressed data. If the identifier is "0", the static dictionary encoded the compressed data. If the identifier is "1", the dynamic dictionary encoded the compressed data.

The identifier determination unit 111, if the identifier of the compressed data is "0", outputs the compressed data to the first expansion conversion unit 112. The identifier determination unit 111, if the identifier of the compressed data is "1", outputs the compressed data to the second expansion conversion unit 113.

The first expansion conversion unit 112 is a processing unit that expands the compressed data to the state when the character code is converted, by using the expansion tree 60. The data structure of the expansion tree 60 corresponds to the one illustrated in FIG. 9. The first expansion conversion unit 112 compares the bit string assigned to each branch of the tree 60 with the compressed data excluding the identifier, and specifies the leaf mapped to the branch with the bit string the same as that of the compressed data. The first expansion conversion unit 112 refers to the specified leaf, and specifies the pointer to a CJK character or a Japanese word. The first expansion conversion unit 112 replaces the character code table 200 of the character code system used at the time of compression, with the character code table 200 of the character code system whose character code is to be converted. The first expansion conversion unit 112 then converts the expanded data of the compressed data to the expanded data whose character code is converted, based on the replacing character code table 200 and the specified pointer. The first expansion conversion unit 112 then outputs the converted expanded data to the file write unit 115.

In FIG. 9, for example, it is assumed that the bit string "010111110111101" hits the branch 60-4 of the tree 60, the compression code length of the leaf 61-4 connected to the branch 60-4 is "11", and the CJK character indicated by the pointer to a CJK character or a word is "東 (East)". In this case, the first expansion conversion unit 112 specifies the expansion character code string "6771" in the character code table 200 converted from UTF-8 to UTF-16, as the expanded data corresponding to the bit string "01011111011" from the top to the eleventh bit, in the bit string of the compressed data.

The second expansion conversion unit 113 is a processing unit that expands the compressed data to the state when the character code is converted, by using the information in the dynamic dictionary unit stored in the storage area B2. The second expansion conversion unit 113 obtains a registration number in the dynamic dictionary unit, by removing the identifier from the compressed data. The second expansion conversion unit 113 compares the obtained registration number with the reference table T1, and specifies the storage position and the data length of the expanded data stored in the storage area B2. The second expansion conversion unit 113 obtains the character code string corresponding to the storage position and the data length from the storage area B2, and generates expanded data from the obtained character code string. The second expansion conversion unit 113 then converts the character code of the generated expanded data, and converts it to the expanded data whose character code is converted. The second expansion conversion unit 113 then outputs the converted expanded data to the file write unit 115.

The processing performed by the second expansion conversion unit 113 will now be explained by assuming that the registration number obtained from the compressed data is, for example, "00000111". The second expansion conversion unit 113 compares the registration number "00000111" with the reference table T1, and obtains the storage position "000000011110" and the data length "1000". The second expansion conversion unit 113 then refers to the storage area B2, and obtains the character code string of the character string "KataokaΔ" that starts from the storage position "000000011110" and has the data length "1000". The second expansion conversion unit 113 then converts the character code of the character code string of the obtained character string "KataokaΔ" from UTF-8 to UTF-16, and converts it to the expanded data whose character code is converted. English characters have the same character code strings in any character code system including ASCII. Consequently, even if the character code of the generated expanded data is converted from UTF-8 to UTF-16, the character code string remains the same.

The updating unit 114 is a processing unit that updates the storage area B1 in which the compressed data is stored. The updating unit 114, if the identifier of the compressed data is "0", deletes the compressed data read out by the first expansion conversion unit 112 from the storage area B1. The updating unit 114, if the identifier of the compressed data is "1", deletes the compressed data read out by the second expansion conversion unit 113 from the storage area B1.

The file write unit 115 is a processing unit that obtains the expanded data from the first expansion conversion unit 112 and the second expansion conversion unit 113, and writes the obtained expanded data in the storage area B3.

The processing procedures of the compression unit 100a and the expansion unit 100b illustrated in FIG. 10 and FIG. 11 will now be described.

Figure 12:
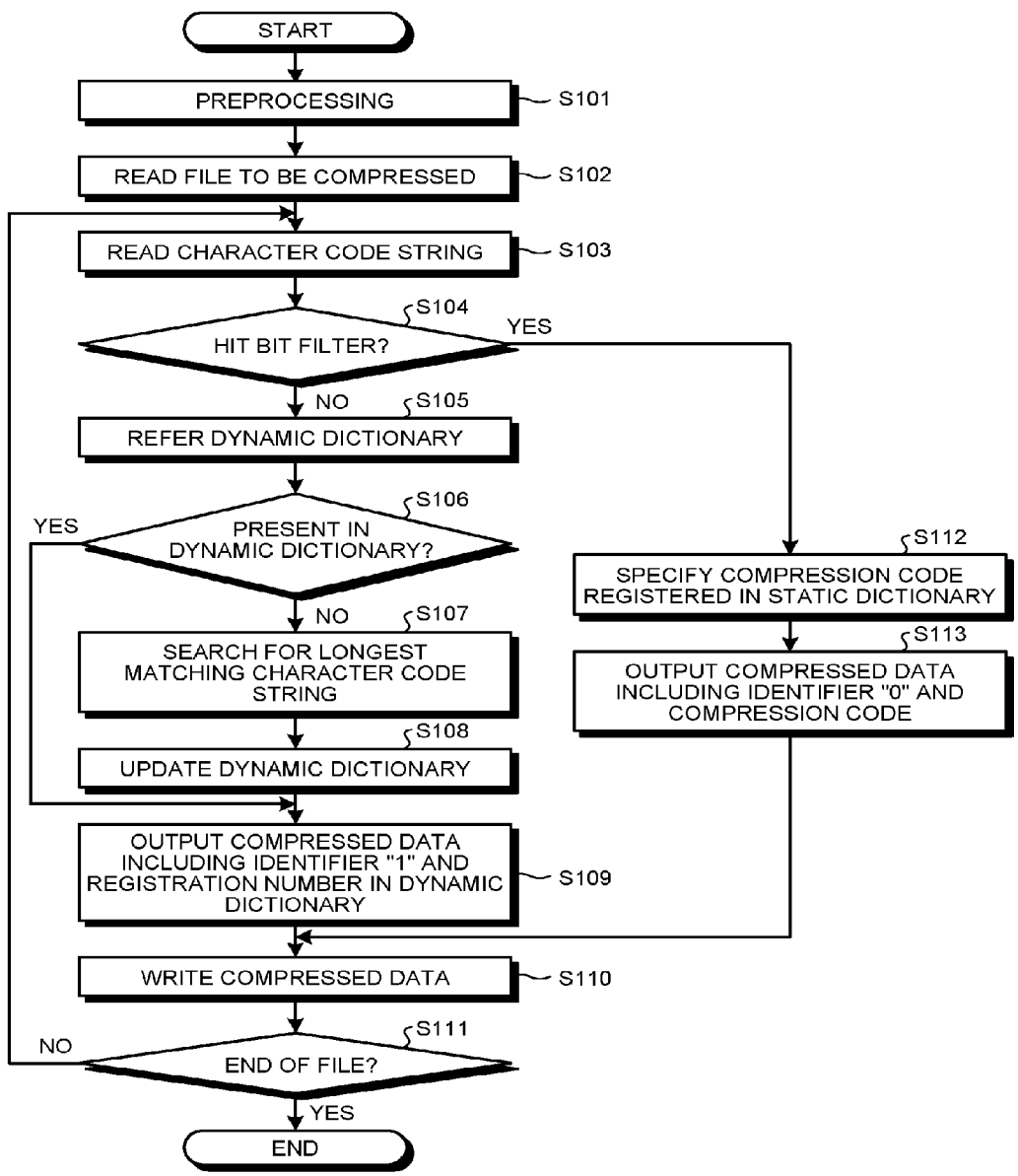
FIG. 12 is a flowchart illustrating a processing procedure performed by the compression unit according to the present embodiment.

FIG. 12 is a flowchart illustrating a processing procedure performed by the compression unit according to the present embodiment. As illustrated in FIG. 12, the compression unit 100a executes preprocessing (step S101). In the preprocessing at step S101, the compression unit 100a acquires the storage area A1, the storage area A2, and the storage area A3 in the storage unit 100c.

The compression unit 100a reads out the file F1 to be compressed (step S102), and extracts a character code string (step S103). The compression unit 100a compares the character code string and with bit filter C1, and determines whether the character code string hits the bit filter C1 (step S104).

If the character code string does not hit the bit filter C1 (No at step S104), the compression unit 100a refers to the dynamic dictionary (step S105). The compression unit 100a then determines whether the character string is already present in the dynamic dictionary (step S106). If the character string is already present in the dynamic dictionary (Yes at step S106), the compression unit 100a proceeds to step S109.

If the character string is not present in the dynamic dictionary (No at step S106), the compression unit 100a searches for the longest matching character code string (step S107). The compression unit 100a then updates the dynamic dictionary (step S108), and proceeds to step S109.

At step S109, the compression unit 100a outputs compressed data including the identifier "1" and the registration number in the dynamic dictionary (step S109). The compression unit 100a then writes the compressed data (step S110), and determines whether it is the end of the file F1 (step S111). If it is not the end of the file F1 (No at step S111), the compression unit 100a proceeds to step S103. If it is the end of the file F1 (Yes at step S111), the compression unit 100a completes the processing.

If at step S104, the character code string hits the bit filter C1 (Yes at step S104), the compression unit 100a specifies the compression code registered in the static dictionary C2 (step S112). The compression unit 100a then outputs compressed data including the identifier "0" and the compression code (step S113), and proceeds to step S110.

Figure 13:
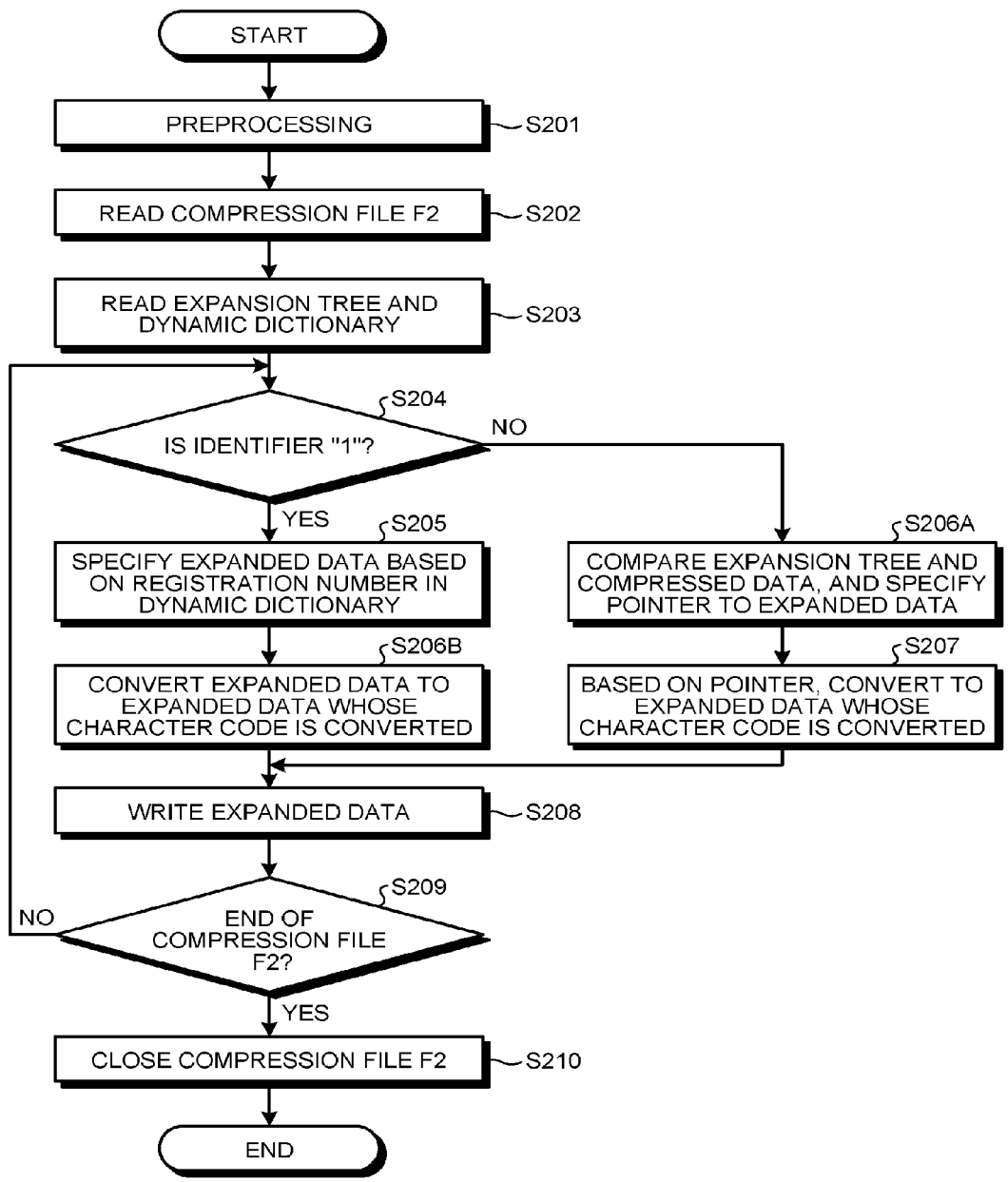
FIG. 13 is a flowchart illustrating a processing procedure performed by the expansion unit according to the present embodiment.

FIG. 13 is a flowchart illustrating a processing procedure performed by the expansion unit according to the present embodiment. As illustrated in FIG. 13, the expansion unit 100b executes preprocessing (step S201). In the preprocessing at step S201, the expansion unit 100b acquires the storage area B1, the storage area B2, and the storage area B3 in the storage unit 100c.

The expansion unit 100b reads out the compression file F2 (step S202), and reads out the expansion tree 60 and the dynamic dictionary (step S203). For example, the expansion unit 100b stores the information on the static dictionary stored in the trailer unit, in the storage area B2.

The expansion unit 100b then determines whether the identifier of the compressed data is "1" (step S204). If the identifier is "0" (No at step S204), the expansion unit 100b compares the expansion tree 60 with the compressed data, and specifies the pointer to the expanded data (step S206A).

The expansion unit 100b, based on the specified pointer, converts the expanded data of the compressed data to the expanded data whose character code is converted (step S207). For example, the expansion unit 100b replaces the character code table 200 of the character code system used at the time of compression, with the character code table 200 of the character code system whose character code is to be converted. The expansion unit 100b, based on the replacing character code table 200 and the specified pointer, converts the expanded data of the compressed data to the expanded data whose character code is converted. The expansion unit 100b then proceeds to step S208.

If the identifier of the compressed data is "1" (Yes at step S204), the expansion unit 100b specifies the expanded data based on the registration number in the dynamic dictionary (step S205). The expansion unit 100b then converts the specified expanded data to the expanded data whose character code is converted (step S206B). The expansion unit 100b then proceeds to step S208. English characters have the same character code strings in any character code system including ASCII. Consequently, for example, even if the character code of the specified expanded data is converted from UTF-8 to UTF-16, the character code string remains the same.

At step S208, the expansion unit 100b writes the expanded data in the storage area B3 (step S208).

The expansion unit 100b then determines whether it is the end of the compression file F2 (step S209). If it is not the end of the compression file F2 (No at step S209), the expansion unit 100b proceeds to step S204. If it is the end of the compression file F2 (Yes at step S209), the expansion unit 100b closes the compression file F2 (step S210), and completes the expansion processing.

The effects of the information processing apparatus 100 according to the present embodiment will now be described. The information processing apparatus 100 according to the present embodiment receives the compression file F2, in which a character data string in the first character code is compressed and encoded in a unit of character string including a single character or a plurality of characters. The information processing apparatus 100 converts a compression code included in the compression file F2, and mapped to a unit of compression and encoding of the character data string, from the information corresponding to a representation of the first character code of the unit of compression and encoding, to the information corresponding to a representation of the second character code of the unit of compression and encoding. The information processing apparatus 100 generates the expansion file F3, from compression information mapped to the unit of compression and encoding of the compressed and encoded character data string, and the unit of compression and encoding of the converted character data string. According to the configuration described above, the information processing apparatus 100 can generate the expansion file F3, to which the character data string whose character code is converted at the time of expansion is output, by performing character code conversion processing only on the portion of conversion information related to the compression and encoding, instead of expanding the compressed and encoded data (compression code) and performing character code conversion processing thereon. Consequently, the information processing apparatus 100 can prevent wasteful use of the storage area used for the expansion processing and the character code conversion processing, compared with when conversion is performed collectively after the expansion. The information processing apparatus 100 can also reduce processing time of the expansion processing and the character code conversion processing, compared with when conversion is performed collectively after the expansion.

The information processing apparatus 100 according to the present embodiment determines whether the identifier of the compression code obtained by compressing the character data string in the first character code system is the first identifier or the second identifier. The information processing apparatus 100, when the identifier of the compression code is the first identifier, specifies the position to the expansion character obtained from the compression code, and based on the character code table 200 obtained by replacing the character code table 200 that stores therein the character data strings of the first character code system with the character code table 200 that stores therein the character data strings of the second character code system, and the pointer to the expansion character, expands the compression code. According to the configuration described above, the information processing apparatus 100 can prevent wasteful use of the storage area used for the expansion processing and the character code conversion processing, compared with when conversion is performed collectively after the expansion. The information processing apparatus 100 can also reduce processing time of the expansion processing and the character code conversion processing, compared with when conversion is performed collectively after the expansion.

The information processing apparatus 100 according to the present embodiment determines whether the character data string to be compressed is registered in the static dictionary C2, based on the static dictionary C2 in which the character data string is mapped to the compression code corresponding to the character data string, and the character data string to be compressed. The information processing apparatus 100, when the character data string to be compressed is registered in the static dictionary C2, compresses the character data string to be compressed to a compression code corresponding to the character data string to be compressed registered in the static dictionary C2. The information processing apparatus 100, when the character data string to be compressed is not registered in the static dictionary C2, registers the character data string to be compressed in the dynamic dictionary, and compresses the character data string to be compressed to information based on the registered position. According to the configuration described above, the information processing apparatus 100 can perform the expansion and the character code conversion by one-pass at the time of expansion, because the character data string to be compressed is compressed into the unit of character.

Figure 14:
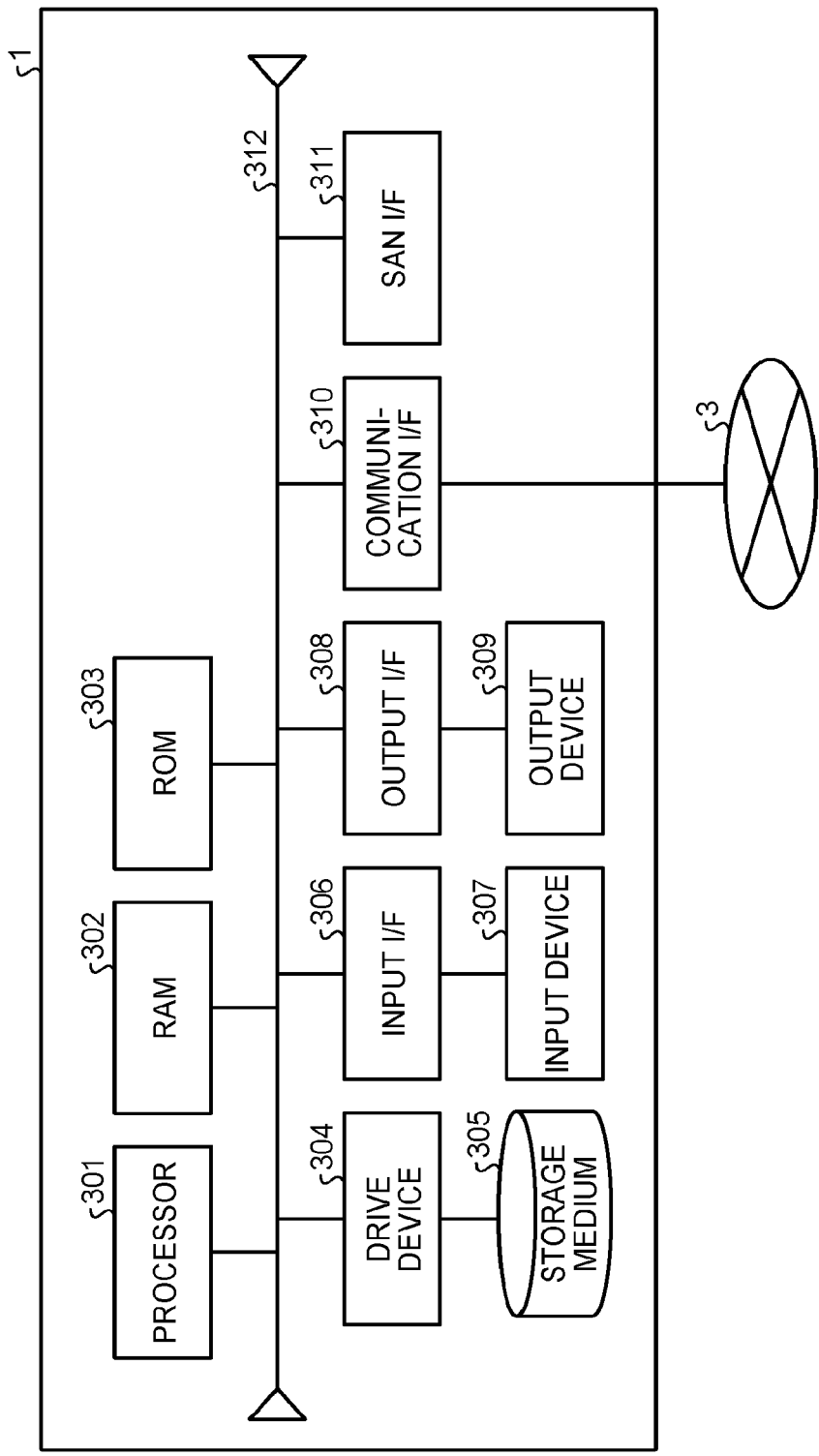
FIG. 14 is a configuration example of hardware in a computer.

In the following, the hardware and software used in the present embodiment will be described. FIG. 14 is a configuration example of hardware in a computer 1. The computer 1, for example, includes a processor 301, random-access memory (RAM) 302, read-only memory (ROM) 303, a drive device 304, storage medium 305, an input interface (I/F) 306, an input device 307, an output interface (I/F) 308, an output device 309, a communication interface (I/F) 310, a storage area network (SAN) interface (I/F) 311, and a bus 312. The pieces of hardware are connected to each other via the bus 312.

The RAM 302 is a readable and writable memory device, and for example, is semiconductor memory such as static RAM (SRAM) and dynamic RAM (DRAM). Alternatively, flash memory and the like may be used instead of the RAM. The ROM 303 also includes programmable ROM (PROM) and the like. The drive device 304 is a device that performs at least one of reading and writing of the information stored in the storage medium 305. The storage medium 305 stores therein the information written by the drive device 304. The storage medium 305, for example, is storage medium such as a hard disk, flash memory such as a solid state drive (SSD), a compact disc (CD), a digital versatile disc (DVD), and a Blu-ray (registered trademark) disc. For example, the computer 1 provides the drive device 304 and the storage medium 305 for each of a plurality of types of storage media.

The input interface 306 is connected to the input device 307, and is a circuit that transmits input signals received from the input device 307 to the processor 301. The output interface 308 is connected to the output device 309, and is a circuit that causes the output device 309 to execute output corresponding to the instruction from the processor 301. The communication interface 310 is a circuit that performs communication control via a network 3. The communication interface 310, for example, is a network interface card (NIC). The SAN interface 311 is a circuit that performs communication control with a storage device connected to the computer 1 through the storage area network. The SAN interface 311, for example, is a host bus adaptor (HBA).

The input device 307 is a device that transmits input signals according to the operation. The input signal, for example, is a key device such as a button mounted on a keyboard or the main body of the computer 1, and a pointing device such as a mouse and a touch panel. The output device 309 is a device that outputs information according to the control of the computer 1. The output device 309, for example, is an image output device (display device) such as a display, and a sound output device such as a speaker. For example, an input/output device such as a touch screen is used as the input device 307 and the output device 309. The input device 307 and the output device 309 may be integrated in the computer 1, or may be a device that is not included in the computer 1, but for example, connected to the computer 1 from outside.

For example, the processor 301 reads out a computer program stored in the ROM 303 and the storage medium 305 to the RAM 302, and performs processing of the compression unit 100a or the processing of the expansion unit 100b, according to the procedure of the computer program being read out. In such a case, the RAM 302 is used as a work area of the processor 301. The functions of the storage unit 100c are achieved, when the ROM 303 and the storage medium 305 store therein computer program files (such as an application program 24, middleware 23, and an operation system (OS) 22, which will be described later), and data files (such as the file F1 to be compressed, and the file F2 that has been compressed), and when the RAM 302 is used as a work area of the processor 301. The computer programs to be read out by the processor 301 will be described with reference to FIG. 15.

Figure 15:
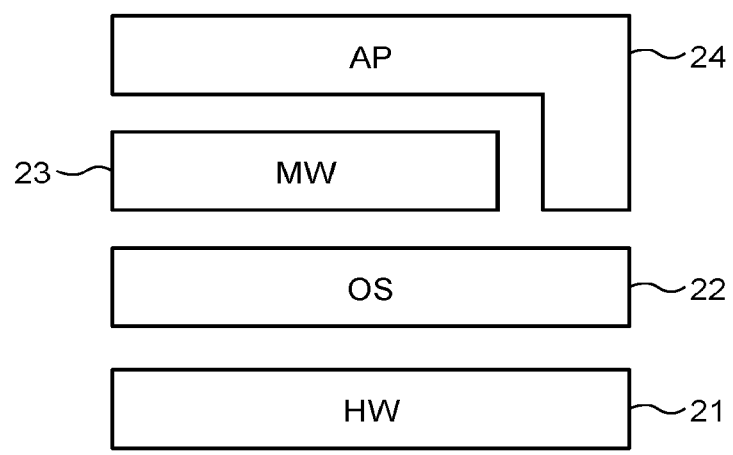
FIG. 15 is a configuration example of computer programs to be operated in a computer.

FIG. 15 is a configuration example of computer programs to be operated in the computer 1. The computer 1 operates the OS 22 that controls a hardware group 21 (301 to 312) illustrated in FIG. 14. The hardware group 21 is controlled and managed when the processor 301 is operated by the procedure according to the OS 22. Consequently, the processing according to the application program 24 or the middleware 23 is executed in the hardware group 21. Furthermore, in the computer 1, the middleware 23 or the application program 24 is read out by the RAM 302 and executed by the processor 301.

The function of the compression unit 100a is achieved when the processor 301, when the compression function is called, performs processing based on at least a part of the middleware 23 or the application program 24 (the processing is performed by controlling the hardware group 21 based on the OS 22). The function of the expansion unit 100b is achieved when the processor 301, when the expansion function is called, performs processing based on at least a part of the middleware 23 or the application program 24 (the processing is performed by controlling the hardware group 21 based on the OS 22). The compression function and the expansion function may be included in the application program 24 itself, or may be a part of the middleware 23 executed when it is called by the application program 24.

The compression file F2 obtained by the compression function of the application program 24 (or the middleware 23) is partially expandable based on a compression dictionary D1 in the compression file F2. To expand the middle portion of the compression file F2, the expansion processing of the compressed data to the portion to be expanded is suppressed. Consequently, the load on the processor 301 is also suppressed. Because the compressed data to be expanded is partially developed on the RAM 302, the work area is also reduced.

Figure 16:
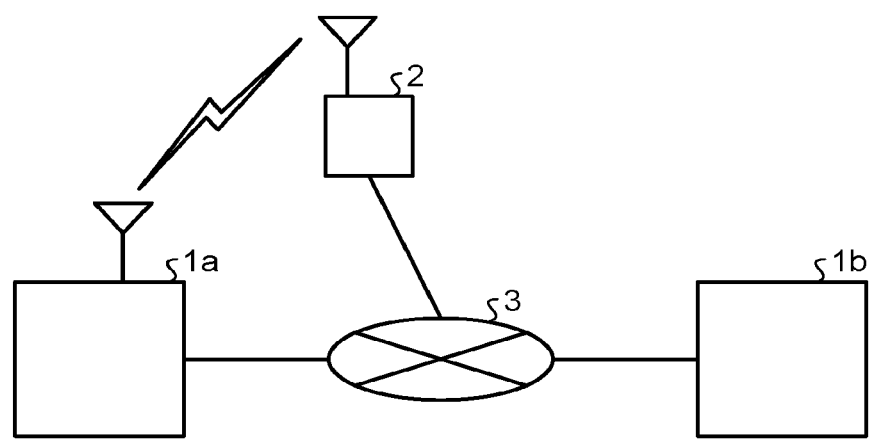
FIG. 16 is a configuration example of devices in the system according to the embodiment.

FIG. 16 is a configuration example of devices in the system according to the embodiment. The system in FIG. 16 includes a computer 1a, a computer 1b, a base station 2, and the network 3. The computer 1a is connected to the network 3, which is connected to the computer 1b, by at least one of wire or wireless.

The compression unit 100a and the expansion unit 100b illustrated in FIG. 6 may be included in either of the computer 1a or the computer 1b illustrated in FIG. 16. The computer 1b may include the compression unit 100a, and the computer 1a may include the expansion unit 100b. The computer 1b may include the compression unit 100a, and the computer 1a may include the expansion unit 100b. Both the computer 1a and the computer 1b may include the compression unit 100a and the expansion unit 100b.

A part of a modification according to the embodiment described above will now be explained. Not only the modification described below, but also various changes in design may be made without departing from the scope of the present invention. The object to be compressed may be a monitor message output from the system, in addition to the data in a file. For example, a monitor message sequentially stored in a buffer may be compressed by the compression processing described above, and stored as a log file or the like. For example, compression may be carried out in a unit of a page in the database, or may be carried out in a unit of a plurality of pages. The data to be compressed, as described above, is not limited to the CJK characters. The compression processing described above may be performed on data in which the CJK characters and alphanumeric characters are mixed, or data such as image and sound.

According to an aspect, it is possible to prevent the wasteful use of the storage area used for the expansion processing and the character code conversion processing, compared with when conversion is performed collectively after the expansion. It is also possible to reduce processing time of the expansion processing and the character code conversion processing, compared with when conversion is performed collectively after the expansion.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a converting program that causes a computer to perform a process, comprising:
   inputting a compressed file in which character string data with a first character code is compressed by a unit of character string including a single character or a plurality of characters;
   converting compression information included in the compressed file into converted compression information, the compression information mapping each of compressed character string data in the compressed file to each of corresponding unit of character string with the first character code, thereby the converted compression information mapping each of the compressed character string data in the compressed file to each of the corresponding unit of character string with a second character code; and
   generating a converted compression file from the converted compression information and each of the compressed character string data.

2. The non-transitory computer-readable recording medium according to claim 1, wherein the converting includes
   determining whether an identifier of the compression information is a first identifier or a second identifier, and
   when the identifier of the compression information is the first identifier, specifying a position to the character string with the first character code obtained from the compression information, and converting the compression information from the character string with the first character code to the character string with the second character code, on a basis of a character code table obtained by replacing a first character code table that stores therein the character string with the first character code with a second character code table that stores therein the character string with the second character code, and the specified position.

3. The non-transitory computer-readable recording medium according to claim 2 wherein, when the identifier of the compression information is the second identifier, the converting includes converting the compression information from the character string with the first character code to the character string with the second character code, on a basis of positional information indicated in information based on a registered position included in the compression information.

4. A converting device, comprising:
   a processor, wherein the processor executes:
   inputting a compressed file in which character string data with a first character code is compressed by a unit of character string including a single character or a plurality of characters;
   converting compression information included in the compressed file into converted compression information, the compression information mapping each of compressed character string data in the compressed file to each of corresponding unit of character string with the first character code, thereby the converted compression information mapping each of the compressed character string data in the compressed file to each of the corresponding unit of character string with a second character code; and
   generating a converted compression file from the converted compression information and each of the compressed character string data.

5. The converting device according to claim 4, wherein the converting includes
   determining whether an identifier of the compression information is a first identifier or a second identifier, and
   when the identifier of the compression information is the first identifier, specifying a position to the character string with the first character code obtained from the compression information, and converting the compression information from the character string with the first character code to the character string with the second character code, on a basis of a character code table obtained by replacing a first character code table that stores therein the character string with the first character code with a second character code table that stores therein the character string with the second character code, and the specified position.

6. A converting method executed by a computer, the conversion method comprising:
   inputting a compressed file in which character string data with a first character code is compressed by a unit of character string including a single character or a plurality of characters using a processor;
   converting compression information included in the compressed file into converted compression information, the compression information mapping each of compressed character string data in the compressed file to each of corresponding unit of character string with the first character code, thereby the converted compression information mapping each of the compressed character string data in the compressed file to each of the corresponding unit of character string with a second character code using the processor; and
   generating a converted compression file from the converted compression information and each of the compressed character string data using the processor.

7. The converting method according to claim 6, wherein the converting includes
   determining whether an identifier of the compression information is a first identifier or a second identifier, and
   when the identifier of the compression information is the first identifier, specifying a position to the character string with the first character code obtained from the compression information, and converting the compression information from the character string with the first character code to the character string with the second character code, on a basis of a character code table obtained by replacing a first character code table that stores therein the character string with the first character code with a second character code table that stores therein the character string with the second character code, and the specified position.

8. A non-transitory computer-readable recording medium having stored therein a compression program that causes a computer to execute a process, comprising:
   determining whether the character string to be compressed is registered in a first dictionary, on a basis of the first dictionary in which each character string is mapped to each compression code, and the character string to be compressed;
   when the character string to be compressed is registered in the first dictionary, compressing the character string to be compressed to a compression code corresponding to the character string to be compressed registered in the first dictionary; and
   when the character string to be compressed is not registered in the first dictionary, registering the character string to be compressed in a second dictionary, and compressing the character string to be compressed to information based on a registered position.

9. A compression device, comprising:
   a processor, wherein the processor executes:
   determining whether the character string to be compressed is registered in a first dictionary, on a basis of the first dictionary in which each character string is mapped to each compression code, and the character string to be compressed;
   when the character string to be compressed is registered in the first dictionary, compressing the character string to be compressed to a compression code corresponding to the character string to be compressed registered in the first dictionary; and
   when the character string to be compressed is not registered in the first dictionary, registering the character string to be compressed in a second dictionary, and compressing the character string to be compressed to information based on a registered position.

* * * * *